United States Patent
Wu et al.

(10) Patent No.: US 7,508,639 B2
(45) Date of Patent: Mar. 24, 2009

(54) INPUT/OUTPUT DEVICES WITH ROBUSTNESS OF ESD PROTECTION

(75) Inventors: Yi-Hsun Wu, Hsinchu (TW); Jian-Hsing Lee, Hsinchu (TW); Shui-Hung Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 534 days.

(21) Appl. No.: 11/305,983

(22) Filed: Dec. 19, 2005

(65) Prior Publication Data

US 2006/0114629 A1    Jun. 1, 2006

Related U.S. Application Data

(63) Continuation-in-part of application No. 10/307,646, filed on Dec. 2, 2002, now abandoned.

(51) Int. Cl.
| | |
|---|---|
| H02H 9/00 | (2006.01) |
| H02H 3/22 | (2006.01) |
| H02H 1/00 | (2006.01) |
| H02H 1/04 | (2006.01) |
| H02H 9/06 | (2006.01) |
| H01C 7/12 | (2006.01) |

(52) U.S. Cl. .................... 361/56; 361/111; 361/118
(58) Field of Classification Search .................. None
See application file for complete search history.

(56) References Cited

U.S. PATENT DOCUMENTS

| | | | |
|---|---|---|---|
| 5,311,391 A | 5/1994 | Dungan et al. | 361/56 |
| 5,444,402 A | 8/1995 | McMahon et al. | 327/170 |
| 5,751,173 A | 5/1998 | McMahon et al. | 327/170 |
| 5,847,575 A | 12/1998 | Galbi et al. | 326/27 |
| 6,249,410 B1 | 6/2001 | Ker et al. | 361/56 |
| 6,576,958 B2 | 6/2003 | Ker et al. | 257/355 |
| 6,671,153 B1 | 12/2003 | Ker et al. | 361/111 |
| 6,809,915 B2 * | 10/2004 | Lai et al. | 361/111 |
| 6,903,913 B2 | 6/2005 | Ker et al. | 361/111 |
| 7,256,975 B2 * | 8/2007 | Wu et al. | 361/56 |

FOREIGN PATENT DOCUMENTS

TW    490785    6/2002

OTHER PUBLICATIONS

Taiwan Office Action mailed Dec. 29, 2005.
"Electronic Circuit Analysis and Design" Neamen; 2001.

* cited by examiner

*Primary Examiner*—Stephen W Jackson
*Assistant Examiner*—Dharti H Patel
(74) *Attorney, Agent, or Firm*—Thomas, Kayden, Horstemeyer & Risley

(57) ABSTRACT

Input/output devices with robustness of ESD protection are provided. An input/output device comprises an input/output pad, a first NMOS transistor, a second NMOS transistor and an ESD detector. The first NMOS transistor comprises a first drain, a first source and a first gate, wherein the first source and the first gate are coupled to a first ground power rail, and the first drain to the input/output pad. The second NMOS transistor comprises a second drain, a second source and a second gate, wherein the second source is coupled to the first ground power rail, the second drain to the input/output pad, and the second gate to a first pre-driver. When an ESD event is detected, the ESD detector makes the first pre-driver couple the second gate to the first ground power rail, thereby the first and second transistors evenly discharge ESD current.

19 Claims, 9 Drawing Sheets

INPUT/OUTPUT DEVICES WITH ROBUSTNESS OF ESD PROTECTION

CROSS REFERENCE TO RELATED APPLICATIONS

This application is a continuation-in-part of U.S. patent application Ser. No. 10/307,646, filed Dec. 2, 2002 now abandoned and entitled "Scheme for eliminating the channel unexpected turn-on during ESD zapping", whose content as a whole is incorporated by reference in this application.

BACKGROUND OF THE INVENTION

1. Field of the Invention

The invention relates to input/output devices for ESD protection in an integrated circuit, and in particular to input/output devices that evenly discharge ESD current during an ESD event.

2. Description of the Related Art

ESD (electrostatic discharge) damage to IC products has become an essential reliability issue among others. As feature size is scaled down to deep sub-micro, the gate oxide of a MOS transistor becomes thinner to render ICs more vulnerable to ESD stress. Industrial standards require input/output (I/O) pins to pass ESD tests of 2000 volts of human body mode (HBM) and 200 volts of machine mode (MM). Generally, ESD protection devices are placed near I/O pads, protecting not only I/O circuits but also core circuits from ESD damage. In order to have enough ESD protection ability, ESD protection devices usually are of a large layout area, thereby dissipating the heat generated during an ESD event and protecting themselves from being burned out. MOS transistors are sometimes utilized for this ESD protection purpose because the parasitic bipolar junction transistor (BJT) under a gate of a MOS transistor might be turned or triggered on during an ESD event. Finger-type MOS transistors, each having multiple parallel finger gates and common sources/drains between adjacent finger gates, are preferred due to their compact size in comparison with others. While providing ESD protection, a finger-type MOS transistor can also act as a post driver in an I/O circuit, which is the final driving stage in an I/O circuit to drive an input port of an external IC. A finger-type MOS transistor, when all finger gates are driven, can provide plenty of driving force to drive the loading effectively rendered by an external IC. The specification of an I/O circuit, depending on a product requirement, may not need the full driving force of a finger-type MOS transistor, nevertheless. If less driving ability is required, some of the finger gates may be coupled to a fixed voltage, such as $V_{cc}$ or $V_{ss}$ (GND), to stop acting like a driver and others of the finger gates may be controlled by a signal to drive accordingly.

FIG. 1 shows a portion of a conventional I/O circuit. There are a finger-type NMOS transistor and a finger-type PMOS transistor in FIG. 1. The finger-type NMOS consists of NMOS transistors ($NMOS_1$-$NMOS_n$), each representing one finger gate and two sources/drains adjacent to the finger gate in the finger-type NMOS transistor. Similarly, the finger-type PMOS transistor consists of PMOS transistors ($PMOS_1$-$PMOS_n$), each representing one finger gate and two sources/drains adjacent to the finger gate in the finger-type PMOS transistor. Rectangle 1 indicates a portion of the finger-type NMOS transistor and a portion of the finger-type PMOS transistor not used as a driver because the gates of the PMOS and NMOS transistors therein are respectively connected to power rail $V_{cc1}$ and $V_{ss1}$, making themselves closed. Rectangle 2 indicates a portion of the finger-type NMOS transistor and a portion of the finger-type PMOS transistor used as a driver, in which the PMOS or NMOS transistors therein are switched to drive according to signals from pre-drivers 11 and 13. Hereinafter, rectangles 1 and 2 are referred as non-used and used parts of a post driver, respectively. No matter whether used as a driver, NMOS transistors $NMOS_1$-$NMOS_n$ and PMOS transistors $PMOS_1$-$PMOS_n$ should provide ESD protection at the same time during an ESD event, theoretically.

The I/O circuit may be problematic in view of ESD protection. As known in the art, the gate voltage of a MOS transistor affects the triggering voltage of the parasitic BJT under the gate. When a high electrostatic voltage relatively positive to a grounded power rail $V_{ss1}$ zaps the pad in FIG. 1, for example, the gate voltage on the finger gates of $NMOS_1$-$NMOS_k$ transistors is in a ground voltage, but that on the finger gates of $NMOS_{k+1}$-$NMOS_n$ might be different from the ground voltage. As a result, BJTs under $NMOS_1$-$NMOS_k$ transistors may have a triggering voltage different from those under $NMOS_{k+1}$-$NMOS_n$ transistors. It implies that even though a finger-type NMOS transistor is used for ESD protection, this scheme of ESD protection is inefficient because not all BJTs in the finger-type NMOS transistor participate at the same time to discharge ESD current.

BRIEF SUMMARY OF THE INVENTION

An embodiment of the invention provides an input/output device with robustness of ESD protection. The input/output device comprises an input/output pad, a first NMOS transistor, a second NMOS transistor and an ESD detector. The first NMOS transistor comprises a first drain, a first source and a first gate, wherein the first source and the first gate are coupled to a first ground power rail, and the first drain to the input/output pad. The second NMOS transistor comprises a second drain, a second source and a second gate, wherein the second source is coupled to the first ground power rail, the second drain to the input/output pad, and the second gate to a first pre-driver. When an ESD event is detected, the ESD detector makes the first pre-driver couple the second gate to the first ground power rail, thereby the first and second transistors evenly discharge ESD current.

An embodiment of the invention provides an input/output device with robustness of ESD protection. The input/output device comprises an input/output pad, a finger-type NMOS transistor, a finger-type PMOS transistor and an ESD detector. The finger-type NMOS transistor has NMOS transistors, each comprising a drain coupled to the input/output pad, a source coupled to a first ground power rail, and a gate. At least one of the NMOS transistors has a gate coupled to the first ground power rail and at least another one of the NMOS transistors has a gate controlled by a first pre-driver. The finger-type PMOS transistor has PMOS transistors, each comprising a drain coupled to the input/output pad, a source coupled to a first relatively high power rail, and a gate. At least one of the PMOS transistors has a gate coupled to the first relatively high power rail and at least another one of the PMOS transistors has a gate controlled by a second pre-driver. When an ESD event is detected, the ESD detector makes the first pre-driver couple the gates of all the NMOS transistors to the first ground power rail, thereby the NMOS transistors evenly discharge ESD current.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
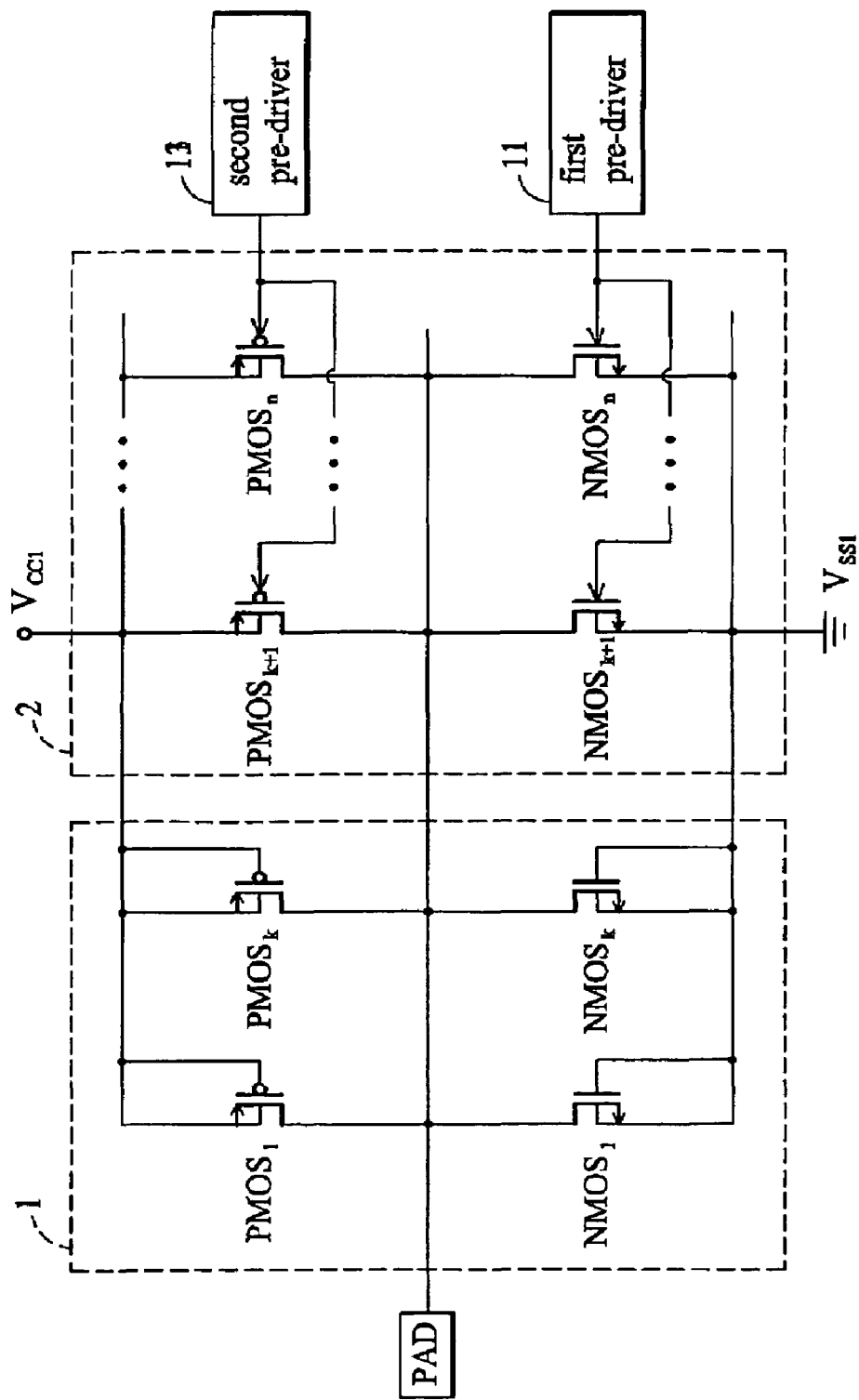
FIG. 1 shows a portion of a conventional I/O circuit.
Figure 2:
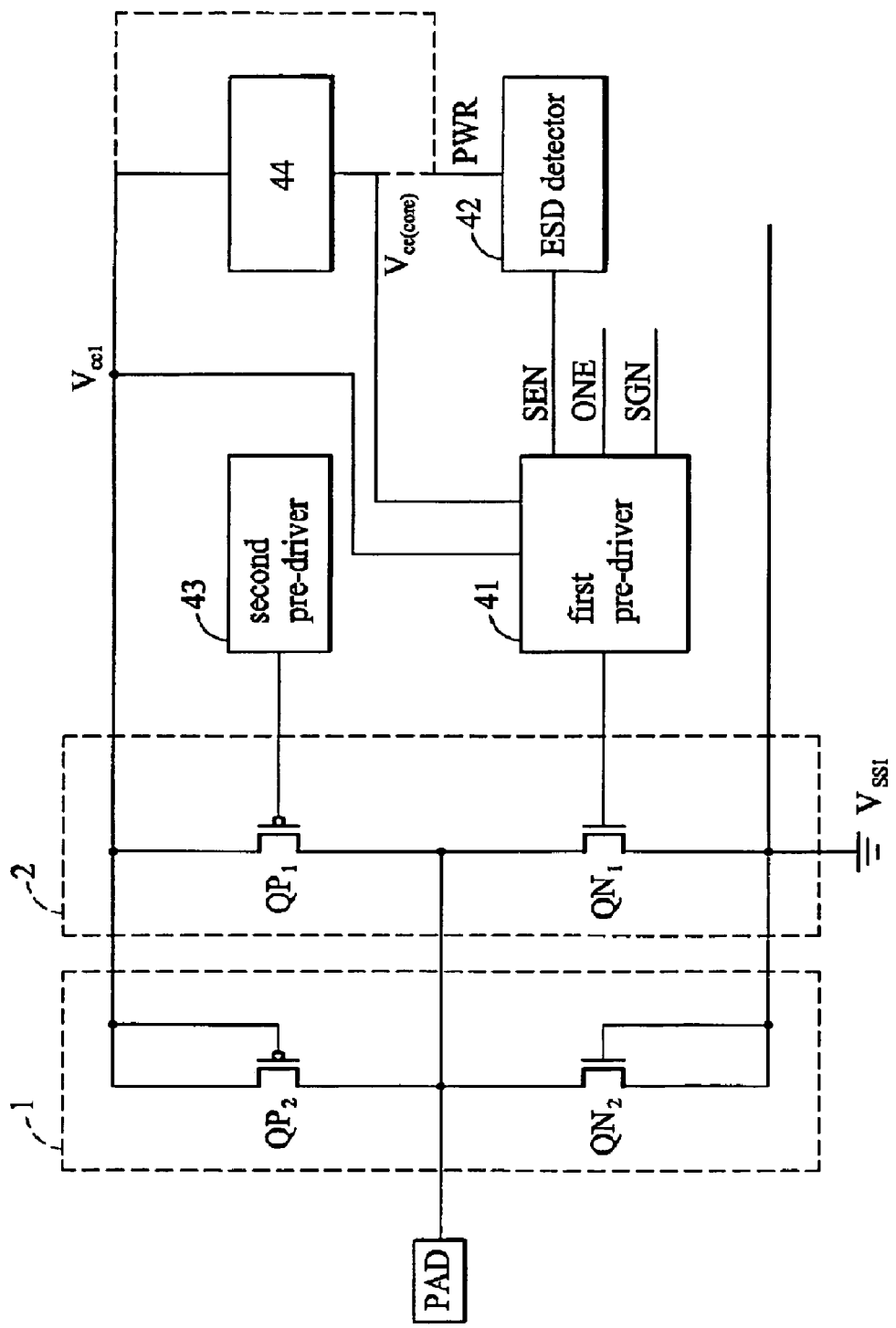
FIG. 2 shows an I/O circuit according to embodiments of the present invention.

FIG. 2 shows an I/O circuit according to embodiments of the invention. The post driver in an I/O circuit can comprise a used part 2 and a non-used part 1. For clarity, only a NMOS transistor and a PMOS transistor are shown in the used part 2, and only another NMOS transistor and another PMOS transistor in the non-used part 1. The NMOS transistors may belong to a finger-type NMOS transistor, and the PMOS transistors may belong to a finger-type PMOS transistor. It can be understood by a person skilled in the art that the number of transistors in the used or non-used part is merely exemplary and can be less or more than 2.

The I/O circuit in FIG. 2 comprises an input/output pad, the used part 2, the non-used part 1, a first pre-driver 41, a second pre-driver 43, a power clamping circuit 44, and an ESD detector 42. The non-used part 1 has a PMOS transistor $QP_2$ with its gate coupled to $V_{cc1}$ and a NMOS transistor $QN_2$ with its gate coupled to $V_{ss1}$. The used part 2 has a PMOS transistor $QP_1$ with its gate governed by the second pre-driver 43 and a NMOS transistor $QN_2$ with its gate governed by the first pre-driver 41. The sources of PMOS transistors $QP_1$ and $QP_2$ are coupled to $V_{cc1}$, and those of NMOS transistors $QN_1$ and $QN_2$ to $V_{ss1}$. All the drains of PMOS transistors $QP_1$ and $QP_2$ and NMOS transistors $QN_1$ and $QN_2$ are coupled together to the input/output pad. Power clamping circuit 44 is coupled between two power rails, $V_{cc1}$ and $V_{cc(core)}$, giving one power rail immunity from the voltage instability of the other. Power rail $V_{cc1}$ is for I/O circuits which generally require a higher voltage (3.3 volts for example) and consume large transient current during driving. Power rail $V_{cc(core)}$ is for core circuits which need a lower voltage (1.8 volts for example) and use current in a relatively-steady amount. Power clamping circuit 44 can pull the voltage of a power rail to approach that of the other when the voltage gap between the two power rails becomes too large. ESD detector 42 can detect whether an ESD event occurs in the I/O pad. This detection can be achieved by coupling the detection node PWR of ESD detector 42 to power rail $V_{cc1}$ or $V_{cc(core)}$, as shown in FIG. 2. When an ESD event is detected, ESD detector 42 will quickly force the first pre-driver 41 to couple the gate of NMOS transistor $QN_1$ to power rail $V_{ss1}$. Since the NMOS transistors $QN_1$ and $QN_2$ both have grounded gates, the trigger voltages of the parasitic BJTs thereunder are the same such that these BJTs can be triggered at the same time to evenly conduct ESD current and achieve efficient ESD protection. During normal operation when there is no ESD event and all power rails are properly powered, the first pre-driver 41 receives an output enable signal ONE and an intermediate output signal SGN to accordingly generate a control signal and switch NMOS transistor $QN_1$.

Figure 3B:
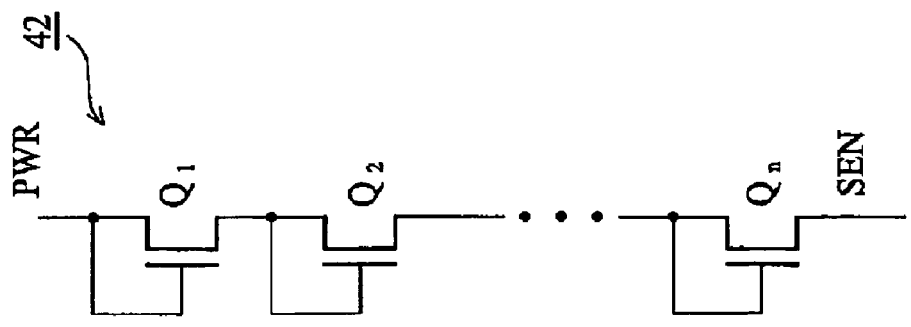
FIGS. 3a and 3b exemplify ESD detector 42 in FIG. 2.
Figure 3A:
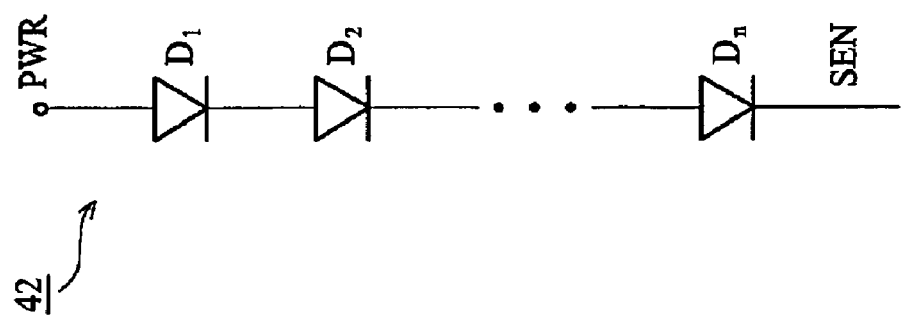

FIGS. 3a and 3b exemplify ESD detector 42 in FIG. 2. ESD detector 42 in FIG. 3a has diodes $D_1$-$D_n$ forward connected in series. These diodes $D_1$-$D_n$ constitute an equivalent macro diode with a threshold voltage equal to the sum of the threshold voltages of all diodes $D_1$-$D_n$. The anode of the macro diode is the anode of $D_1$, symbolized as a detection node PWR. The cathode of the macro diode is the cathode of $D_n$, used to generate a detection signal SEN. The detection node PWR is coupled to power rail $V_{cc1}$ or power rail $V_{cc(core)}$. Once the voltage of power rail $V_{cc1}$ or $V_{cc(core)}$ skyrockets and exceeds the threshold voltage of the macro diode because of the occurrence of an ESD event on the pad, the voltage of the detection signal SEN soars and an activated detection signal SEN occurs. In response to the activated detection signal SEN, the first pre-driver 41 couples the gate of the NMOS transistor $QN_1$ to power rail $V_{ss1}$, thereby equalizing the triggering voltages of the BJTs under the NMOS transistors $QN_1$ and $QN_2$.

Each diode in FIG. 3a can be replaced by a diode of any kind, such as the NMOS diodes shown in FIG. 3b. When a NMOS transistor has a drain and a gate connected together, the NMOS performs as a diode, the drain/gate being the anode of the diode, the source the cathode of the diode. In FIG. 3b, there are n NMOS diodes $Q_1$-$Q_n$ forward connected in series.

Figure 4:
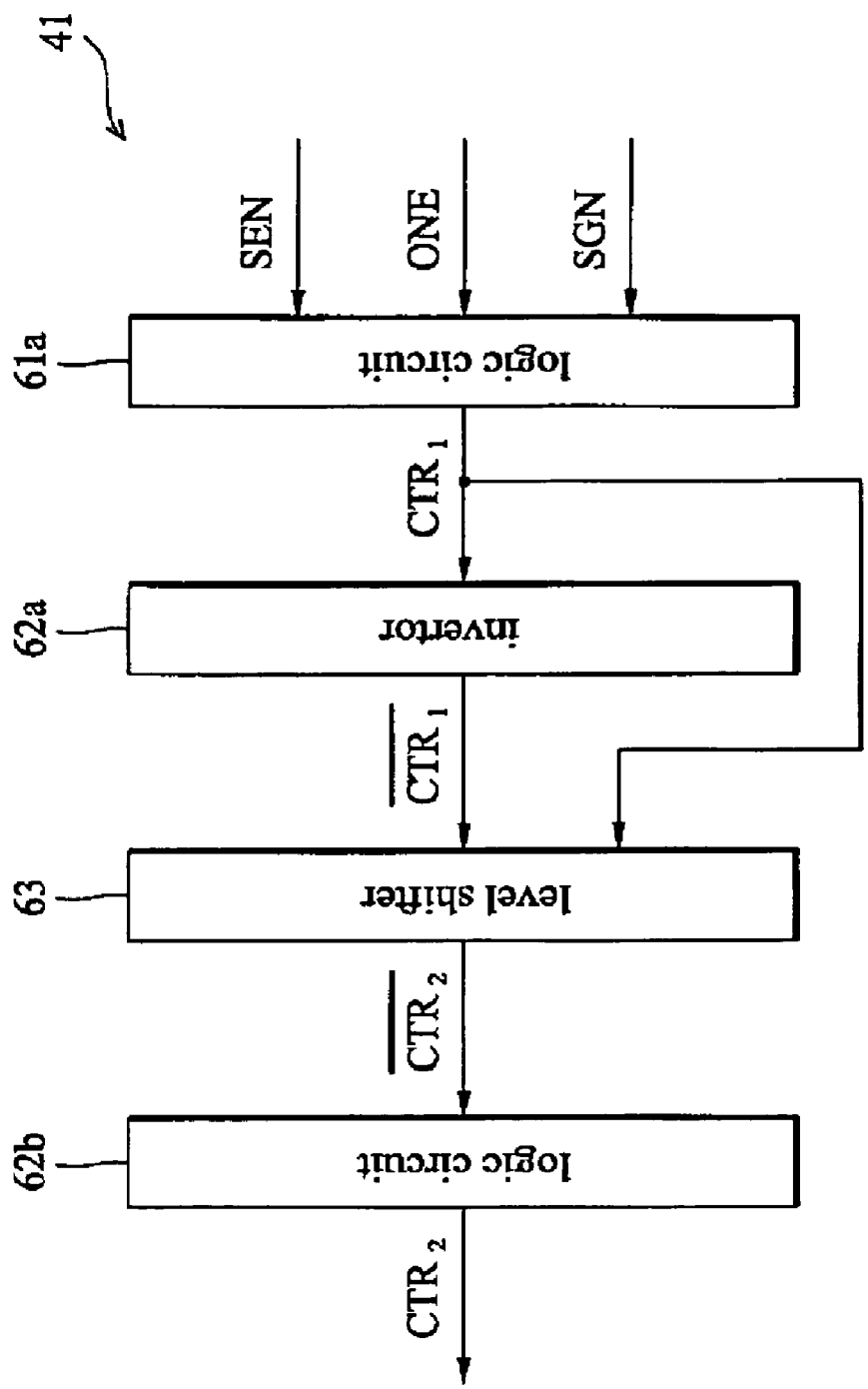
FIG. 4 exemplifies a functional diagram of the first pre-driver 41 in FIG. 2.

FIG. 4 exemplifies a functional diagram of the first pre-driver 41 in FIG. 2. As exemplified in FIG. 4, the first pre-driver 41 comprises a logic circuit 61a, inverters 62a and 62b, and a level shifter 63. Logic circuit 61a executes logic operation and outputs a control signal $CTR_1$ according to detection signal SEN, output enable signal ONE, and intermediate output signal SGN. Inverter 62a or 62b provides an inverted signal opposite to its input signal. Level shifter 63 shifts the voltage level of control signal $CTR_1$-bar to accordingly generate control signal $CTR_2$-bar and accommodate the voltage level requirement of the post driver. If the power rail $V_{cc(core)}$ is 1.8V, for example, the voltage levels for a binary code, generated by logic circuit 61a or inverter 62a, may be 0 volts for logic 0 and 1.8 volts for logic 1. If the power rail $V_{cc1}$ is 3.3V, for example, the voltage levels for a binary code, generated by level shifter 63 or inverter 62b, may be 0 volts for logic 0 and 3.3 volts for logic 1. Level shifter 63 generates a $CTR_2$-bar with 3.3 volts if a $CTR_1$-bar with 1.8 volts and a $CTR_1$ with 0 volts are input.

Figure 5:
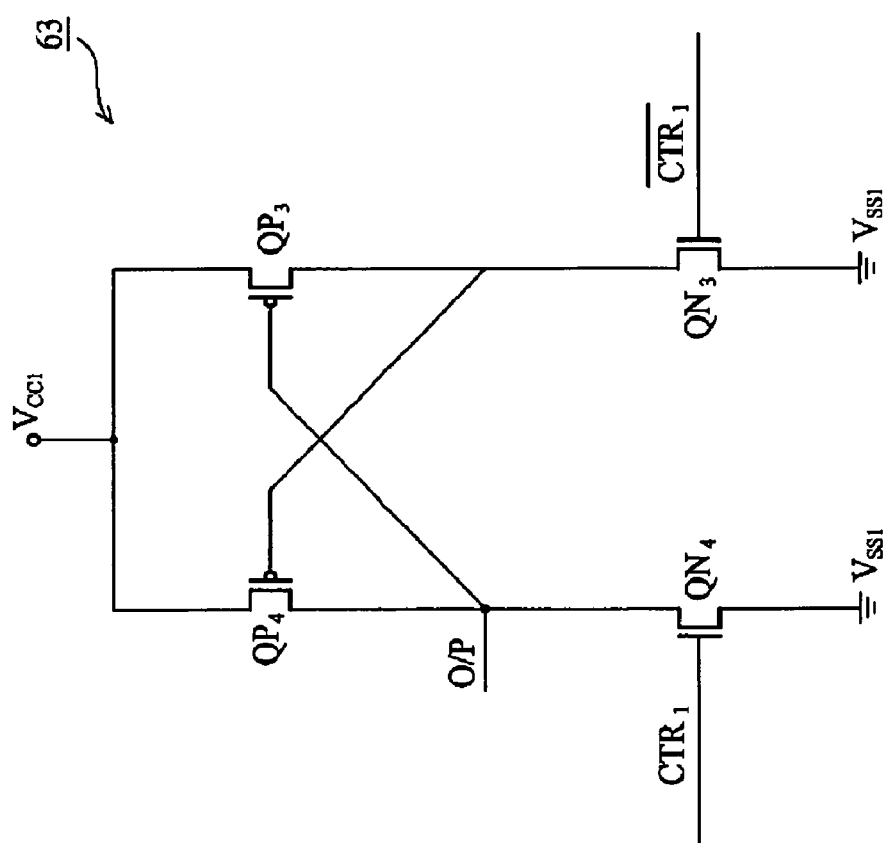
FIG. 5 exemplifies the detail circuit of level shifter 63 in FIG. 4.

FIG. 5 exemplifies the detail circuit of level shifter 63 in FIG. 4. Each of PMOS transistors $QP_3$ and $QP_4$ has a source powered by power rail $V_{cc1}$ and a gate coupled to the drain of the other PMOS transistor. NMOS transistors $QN_3$ and $QN_4$ have sources powered by power rail $V_{ss1}$, drains respectively coupled to the drains of PMOS transistors $QP_3$ and $QP_4$, and gates respectively receiving control signals $CTR_1$-bar and CTR$_1$. The drain of PMOS transistor QP$_4$ or the drain of NMOS transistor QN$_4$ is the output node of level shifter 63.

Figure 6:
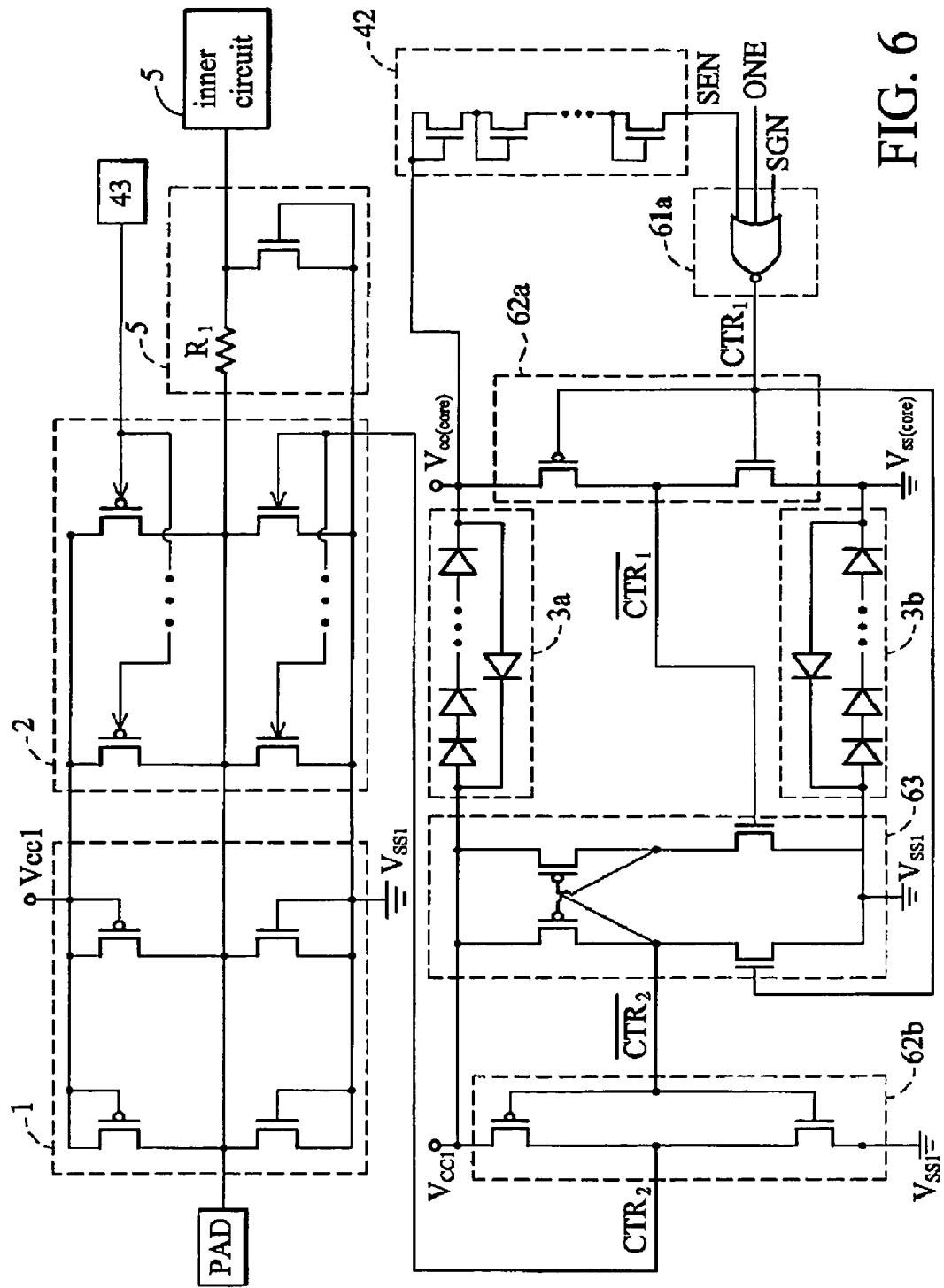
FIG. 6 details the circuit of a first embodiment of the invention according to FIGS. 2-4.

FIG. 6 details the circuit of a first embodiment of the invention according to FIGS. 2-4. NMOS transistors or PMOS transistors, no matter whether in used part 2 or in non-used part 1, are drawn in a plural form to represent finger gates in a finger-type MOS transistor. Secondary ESD protection circuit 5 is coupled between an inner circuit 5 and the used part 2. Connecting between power rails V$_{cc1}$ and V$_{cc(core)}$ is power clamping circuit 3$a$ and connecting between power rails V$_{ss1}$ and V$_{ss(core)}$ is power clamping circuit 3$b$. Each inverter consists of a PMOS transistor and a NMOS transistor, while inverter 62$a$ is powered by power rails V$_{cc(core)}$ and V$_{ss(core)}$, and invertor 62$b$ by power rails V$_{cc1}$ and V$_{ss1}$. Logic circuit 61$a$ is represented by a NOR gate with 3 inputs, powered by power rails V$_{cc(core)}$ and V$_{ss(core)}$. In this first embodiment, ESD detector 42 detects the voltage of power rail V$_{cc(core)}$, as shown in FIG. 6.

During normal operation when all power rails are connected to proper power sources and no ESD event occurs, the voltage level of power rail V$_{cc(core)}$ does not surpass the threshold voltage of the macro diode in ESD detector 42, such that the voltage level of detection signal SEN approaches 0, equivalent to logic 0. Therefore, the output signal of the NOR gate, CTR$_1$, as well as control signal CTR$_2$ and the gate voltages on the NMOS transistors in the used part 2, solely depend on output enable signal ONE and intermediate output signal SGN, acting the normal functions of a normal I/O circuit in the art.

An ESD event occurs when power rail V$_{ss1}$ or V$_{ss(core)}$ is grounded, other power rails are floating, and ESD charge positive to ground voltage zaps on the pad. Due to the ESD charge conducted to the pad, the voltage on the pad skyrockets. The diodes parasitic under the finger-type PMOS transistor conduct partial of the ESD charge to power rail V$_{cc1}$ and raise the voltage of power rail V$_{cc1}$. Power clamping circuit 3$a$ starts to pour ESD charge into power rail V$_{cc(core)}$ and raises the voltage of power rail V$_{cc(core)}$ if the voltage gap between power rails V$_{cc(core)}$ and V$_{cc1}$ exceeds the range that power clamping circuit 3$a$ can block. Similar to the theory for the rising of the voltage on power rail V$_{cc(core)}$, once power rail V$_{cc(core)}$ has a voltage level higher than the threshold voltage of the macro diode in ESD detector 42, the voltage level of detection signal SEN starts to climb up. In the meantime, power rails V$_{cc(core)}$ and V$_{cc1}$ are temporarily powered by the ESD charge, but have different, rising voltage levels, and all the devices in FIG. 6 are activated. Once the voltage level of detection signal SEN is high enough to switch its logic value from 0 to 1, control signal CTR$_1$ is forced to be logic 0 and consequentially, control signal CTR$_2$ is forced to be logic 0 to couple the gates of the NMOS transistors in used part 2 to power rail V$_{ss1}$. In other words, during an ESD event, ESD detector 42 governs control signal CTR$_2$ to couple the gates of the NMOS transistors in used part 2. Thus, all the finger gates of the finger-type NMOS transistor in the used part 2 and the non-used part 1 are all grounded, such that the BJTs under the finger gates have equivalent triggering voltages to evenly discharge ESD charge on the pad.

Figure 7:
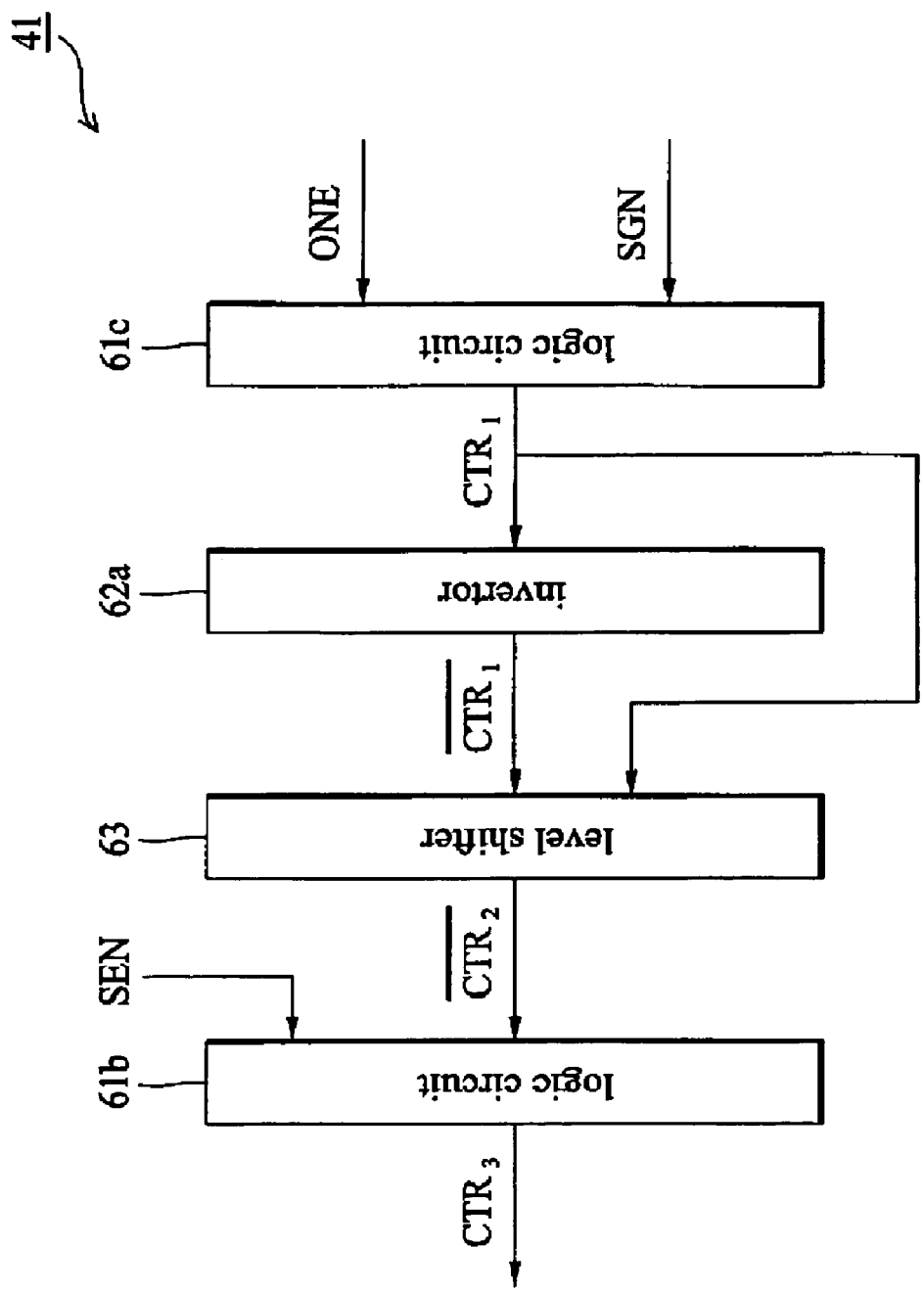
FIG. 7 exemplifies another functional diagram of the first pre-driver 41 in FIG. 2.

Detection signal SEN can be fed to a logic circuit powered by power rails V$_{cc1}$ and V$_{ss1}$ instead of the logic circuit 61$a$ powered by power rails V$_{cc(core)}$ and V$_{ss(core)}$. FIG. 7 exemplifies another functional diagram of the first pre-driver 41 in FIG. 2. Logic circuit 61$c$ executes logic operation and outputs a control signal CTR$_1$ according to output enable signal ONE, and intermediate output signal SGN. Inverter 62$a$ provides an inverted signal opposite to control signal CFR$_1$. Level shifter 63 shifts the voltage level of control signal CTR$_1$-bar to accommodate the voltage level required by the post driver. Logic circuit 61$b$ executes logic operation and outputs a control signal CTR$_3$ according to detection signal SEN and control signal CTR$_2$-bar.

Figure 8:
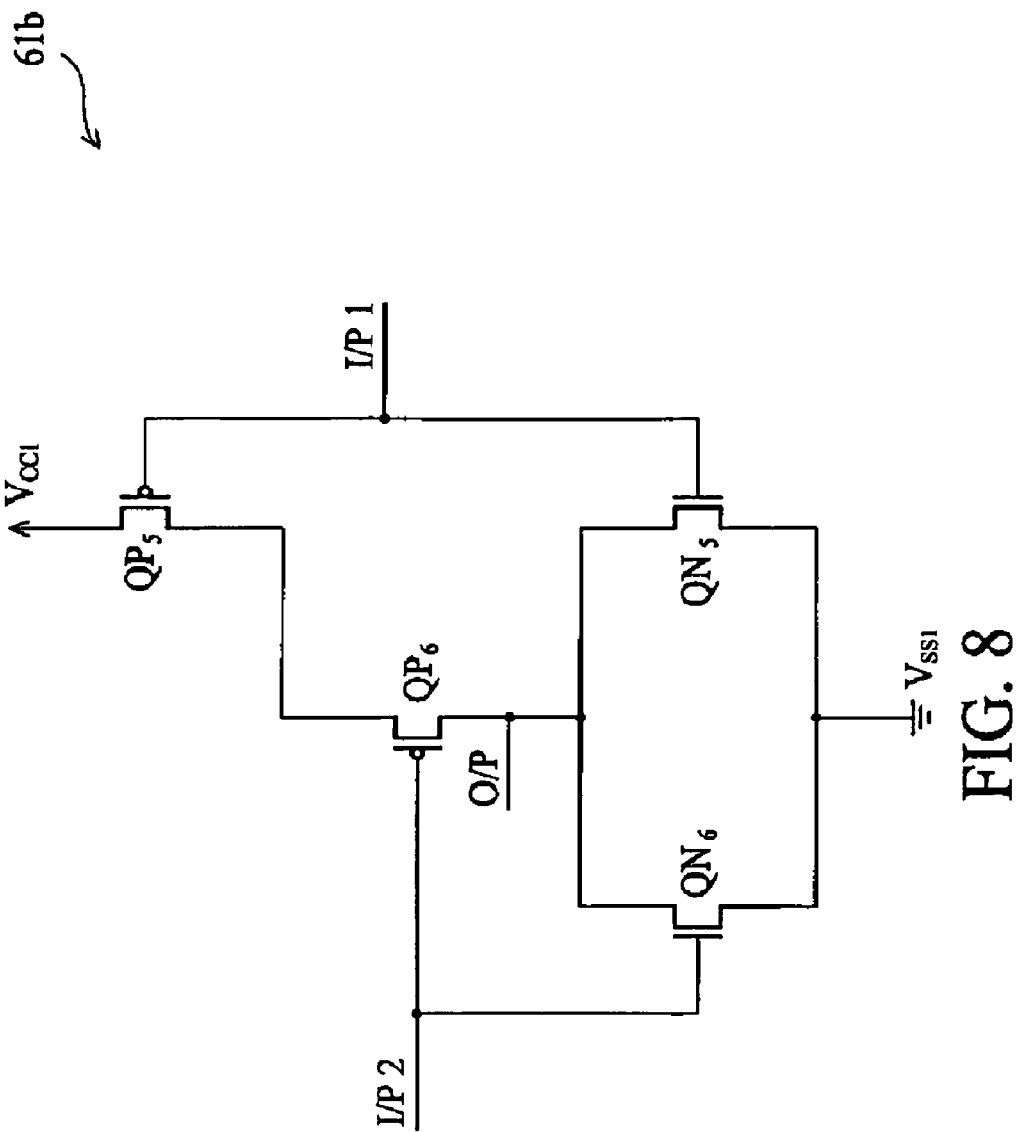
FIG. 8 shows a circuit for a NOR gate.

Logic circuits 61$c$ and 61$b$ may be NOR gates, each having two inputs. Since logic circuit 61$b$ stays to process signals from level shifter 63, it is powered by power rails V$_{cc1}$ and V$_{ss1}$, as shown in FIG. 8. All devices processing signals before level shifter 63 should be powered by power rails other than power rails V$_{cc1}$ and V$_{ss1}$.

Figure 9:
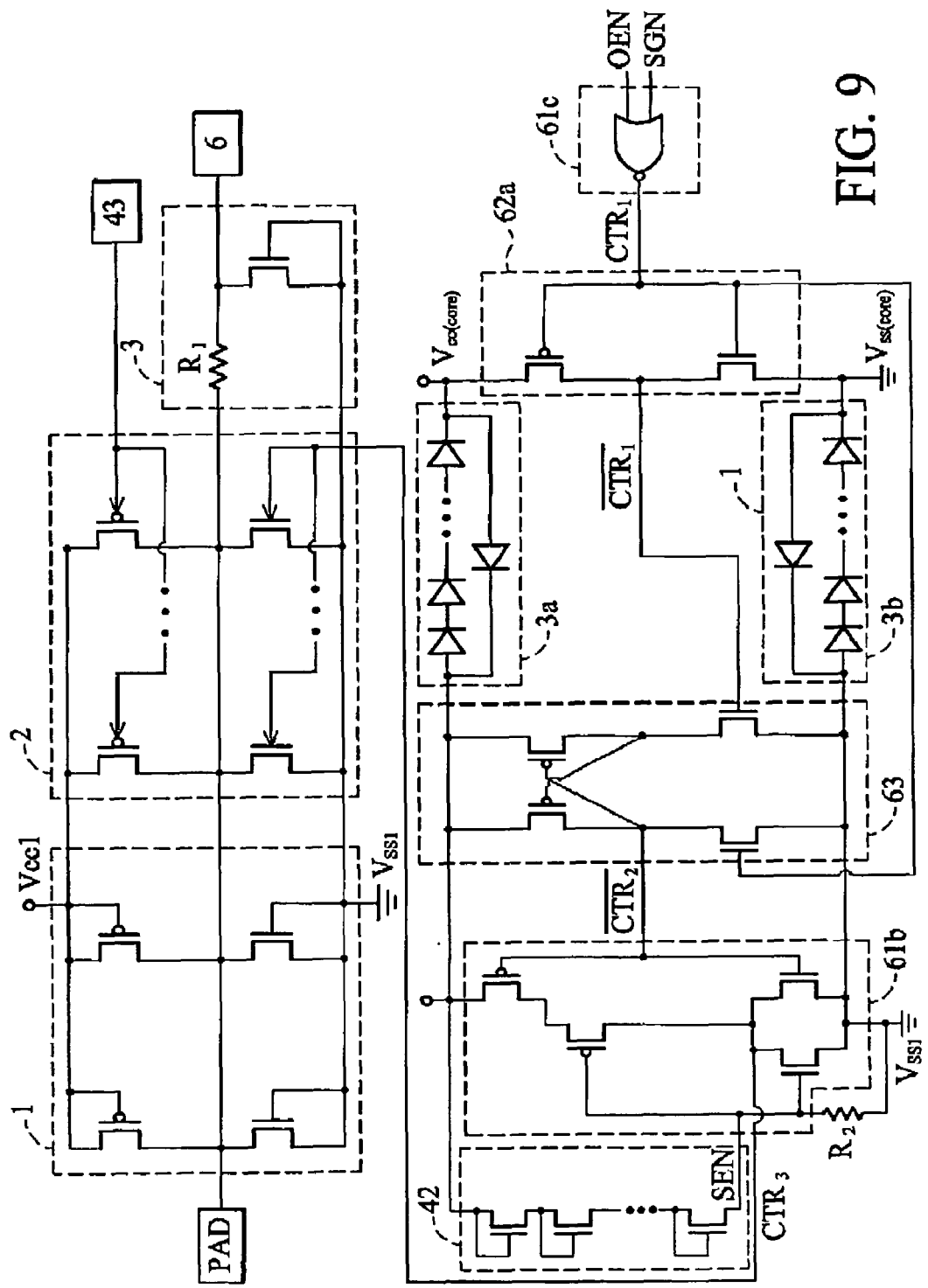
FIG. 9 details the circuit of a second embodiment of the invention according to FIGS. 2, 7 and 8.

FIG. 9 details the circuit of a second embodiment of the invention according to FIGS. 2, 7 and 8. For clarity, the same devices having been shown in FIG. 6 are self-explanatory and their explanations are omitted here. Logic circuit 61$c$ is represented by a NOR gate with 2 inputs, receiving output enable signal ONE and intermediate output signal SGN. Logic circuit 61$b$ is also represented by a NOR gate with 2 inputs, receiving ESD detection signal SEN and control signal CTR$_2$-bar. In this second embodiment, ESD detector 42 detects the voltage of power rail V$_{cc1}$, as shown in FIG. 9. Resistor R$_2$ is coupled between ESD detector 42 and power rail V$_{ss1}$ and its function will be explained later.

During normal operation when all power rails are connected to proper powers and no ESD event occurs, the voltage level of power rail V$_{cc1}$ does not surpass the threshold voltage of the macro diode in ESD detector 42, such that the voltage level of detection signal SEN is determined by resistor R$_2$. Since resistor R$_2$ is coupled to V$_{ss1}$, the voltage level of detection signal SEN approaches 0, equivalent to logic 0. In other words, resistor R$_2$ ascertains that ESD detection signal SEN is at logic 0 during a normal operation. Therefore, the output signal of logic circuit 61$b$, CTR$_3$, as well as the gate voltages on the NMOS transistors in the used part 2, solely depend on control signal CTR$_2$, which depends on control signal CTR$_1$, which depends on output enable signal ONE and intermediate output signal SGN, acting the normal functions of a normal I/O circuit in the art.

An ESD event occurs when power rail V$_{ss1}$ or V$_{ss(core)}$ is grounded, other power rails are floating, and ESD charge positive to ground voltage zaps on the pad. Due to the ESD charge conducted to the pad, the voltage on the pad skyrockets. The diodes parasitic under the finger-type PMOS transistor conduct partial of the ESD charge to power rail V$_{cc1}$ and raise the voltage of power rail V$_{cc1}$. Once power rail V$_{cc1}$ has a voltage level higher than the threshold voltage of the macro diode in ESD detector 42, the voltage level of detection signal SEN starts to climb up. In the meantime, power rail V$_{cc1}$ is temporarily powered by the ESD charge and logic circuit 61$b$ and level shifter 63 are activated. Once the voltage level of detection signal SEN is high enough to switch its logic value from 0 to 1, control signal CTR$_3$ is forced to be logic 0 and couple the gates of the NMOS transistors in used part 2 to power rail V$_{ss1}$. Thus, all the finger gates of the finger-type NMOS transistor in the used part 2 and the non-used part 1 are all grounded, such that the BJTs under the finger gates have equivalent triggering voltages to evenly discharge ESD charge on the pad.

Contrary to the finger-type NMOS transistor in the art, which cannot evenly discharge ESD charge, the embodiments of the present invention, in the presence of an ESD event, force a pre-driver to couple the gates of the finger-type NMOS transistor to ground, such that the BJTs under the gates can be evenly triggered to discharge ESD charge.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An input/output device with robustness of ESD protection, comprising
   an input/output pad;
   a first NMOS transistor, comprising a first drain, a first source and a first gate, wherein the first source and the first gate are coupled to a first ground power rail, and the first drain to the input/output pad;
   a second NMOS transistor, comprising a second drain, a second source and a second gate, wherein the second source is coupled to the first ground power rail, the second drain to the input/output pad, and the second gate to a first pre-driver receiving an output enable signal and an intermediate output signal and comprising a first logic circuit and a level shifter; and
   an ESD detector coupled to the first pre-driver, wherein when an ESD event is detected, the ESD detector makes the first pre-driver couple the second gate to the first ground power rail, thereby the first and second transistors evenly discharge ESD current, wherein the first logic circuit is controlled by the output enable signal and the intermediate output signal to generate a control signal when the output enable signal is activated, and wherein the level shifter shifts the voltage level of the control signal.

2. The input/output device as claimed in claim 1, wherein the ESD detector comprises a plurality of diodes forward connected in series.

3. The input/output device as claimed in claim 2, wherein the ESD detector comprises a plurality of NMOS diodes forward connected in series.

4. The input/output device as claimed in claim 1, wherein the first logic circuit is a NOR gate.

5. The input/output device as claimed in claim 1, wherein the level shifter comprises:
   a first PMOS transistor, comprising a third drain, a third source, and a third gate, wherein the third source is coupled to a first relatively-high power rail Vcc1;
   a third NMOS transistor, comprising a fourth drain, a fourth source, and a fourth gate, wherein the fourth drain is coupled to the third drain, and the fourth source to the first ground power rail;
   a second PMOS transistor, comprising a fifth drain, a fifth source, and a fifth gate, wherein the fifth source is coupled to the first relatively-high power rail Vcc1, the fifth gate to the third drain, and the fifth drain to the third gate; and
   a fourth NMOS transistor, comprising a sixth drain, a sixth source, and a sixth gate, wherein the sixth drain is coupled to the fifth drain, the sixth drain is coupled to the first ground power rail, and the sixth gate receives the control signal.

6. The input/output device as claimed in claim 1, wherein the first pre-driver further comprises two inverters.

7. The input/output device as claimed in claim 1, further comprising a power clamping circuit between first and second relatively high power rails Vcc1 and Vcc(core), wherein the first logic circuit and the ESD detector are coupled to the second relatively high power rail, and during the ESD event, the ESD detector governs the control signal to couple the second gate to the first ground power rail.

8. The input/output device as claimed in claim 1, further comprising a power clamping circuit between first and second relatively high power rails Vcc1 and Vcc(core), wherein the first pre-driver further comprises a second logic circuit powered by the first relatively high power Vcc1 and controlled by the level shifter and the ESD detector, and wherein the second logic circuit, during the ESD event, couples the second gate to the first ground power rail.

9. The input/output device as claimed in claim 8, wherein the second logic circuit is a NOR gate.

10. The input/output device as claimed in claim 1, further comprising a PMOS transistor with a source coupled to a first relatively high power rail Vcc1, a drain coupled to the input/output pad, and a gate coupled to a second pre-driver.

11. An input/output device with robustness of ESD protection, comprising
    an input/output pad;
    a finger-type NMOS transistor with NMOS transistors, each comprising a drain coupled to the input/output pad, a source coupled to a first ground power rail, and a gate, wherein at least one of the NMOS transistors has a gate coupled to the first ground power rail and at least another one of the NMOS transistors has a gate controlled by a first pre-driver receiving an output enable signal and an intermediate output signal and comprising a first logic circuit and a level shifter;
    a finger-type PMOS transistor with PMOS transistors, each comprising a drain coupled to the input/output pad, a source coupled to a first relatively high power rail, and a gate, wherein at least one of the PMOS transistors has a gate coupled to the first relatively high power rail and at least another one of the PMOS transistors has a gate controlled by a second pre-driver; and
    an ESD detector coupled to the first pre-driver, wherein when an ESD event is detected, the ESD detector makes the first pre-driver couple the gates of all the NMOS transistors to the first ground power rail, thereby the NMOS transistors evenly discharge ESD current, wherein the first logic circuit is controlled by the output enable signal and the intermediate output signal to generate a control signal when the output enable signal is activated, and wherein the level shifter shifts the voltage level of the control signal.

12. The input/output device as claimed in claim 11, wherein the first pre-driver comprises:
    a first logic circuit controlled by an output enable signal and an intermediate output signal to generate a control signal when the output enable signal is activated; and
    a level shifter for shifting the voltage level of the control signal;
    wherein the control signal governs the gate of the another one of the NMOS transistors during normal operation.

13. The input/output device as claimed in claim 11, wherein the ESD detector comprises a plurality of diodes forward connected in series.

14. The input/output device as claimed in claim 11, wherein the ESD detector comprises a plurality of NMOS diodes forward connected in series.

15. The input/output device as claimed in claim 11, further comprising a power clamping circuit between the first relatively high power and a second relatively high power rail, wherein the first relatively high power rail is for I/O circuits, and the second relatively high power rail is for core circuits.

16. The input/output device as claimed in claim 15, wherein the ESD detector detects the voltage on the first relatively high power rail to determine the occurrence of the ESD event.

17. The input/output device as claimed in claim 15, wherein the ESD detector detects the voltage on the second relatively high power rail to determine the occurrence of the ESD event.

18. The input/output device as claimed in claim 15, wherein the ESD detector is coupled to a logic circuit in the first pre-driver, and the logic circuit is powered by the first relatively high power rail.

19. The input/output device as claimed in claim 15, wherein the ESD detector is coupled to a logic circuit in the first pre-driver, and the logic circuit is powered by the second relatively high power rail.

* * * * *